United States Patent [19]
Enge et al.

[11] Patent Number: 5,689,112
[45] Date of Patent: Nov. 18, 1997

[54] APPARATUS FOR DETECTION OF SURFACE CONTAMINATIONS ON SILICON WAFERS

[76] Inventors: Harald A. Enge, 20 Nason Hill Rd., Sherborn, Mass. 01770-0201; William A. Lanford, P.O. Box 53, Malden Bridge, N.Y. 12115

[21] Appl. No.: 631,059

[22] Filed: Apr. 12, 1996

[51] Int. Cl.$^6$ .................................. H01J 49/44
[52] U.S. Cl. ............................ 250/309; 250/297
[58] Field of Search .................... 250/309, 306, 250/307, 396 R, 396 ML, 492.2, 492.21, 281, 282, 296, 297, 298, 294

[56] References Cited

U.S. PATENT DOCUMENTS

| | | | |
|---|---|---|---|
| 3,213,276 | 10/1965 | Enge | 250/41.9 |
| 3,778,626 | 12/1973 | Robertson | 250/492 |
| 4,234,797 | 11/1980 | Ryding | 250/492 B |
| 4,829,179 | 5/1989 | Aoki et al. | 250/309 |
| 4,864,130 | 9/1989 | Gruen et al. | 250/309 |
| 5,059,785 | 10/1991 | Doyle et al. | 250/309 |
| 5,166,521 | 11/1992 | Hayashi et al. | 250/309 |
| 5,495,110 | 2/1996 | Ohnishi et al. | 250/309 |

OTHER PUBLICATIONS

Nuclear Instruments and Methods in Physics Research B 118 (1996) pp. 782–786 "In–Situ Rutherford backscattering design for early SIMOX–SOI" Allen et al.

*Primary Examiner*—Kiet T. Nguyen
*Attorney, Agent, or Firm*—Nields, Lemack & Dingman

[57] ABSTRACT

Surface contamination of silicon wafers is detected by a combined beam-deflecting magnet and magnetic spectrometer system. Heavy ions are directed onto the surface of a silicon wafer through the beam-deflecting magnet, and ions back-scattered from contaminants in the surface of the wafer pass through the magnetic spectrometer onto a focal-plane detector. One or more Einzel lenses prevent ions back-scattered from the silicon in the wafer from reaching the detector.

10 Claims, 3 Drawing Sheets

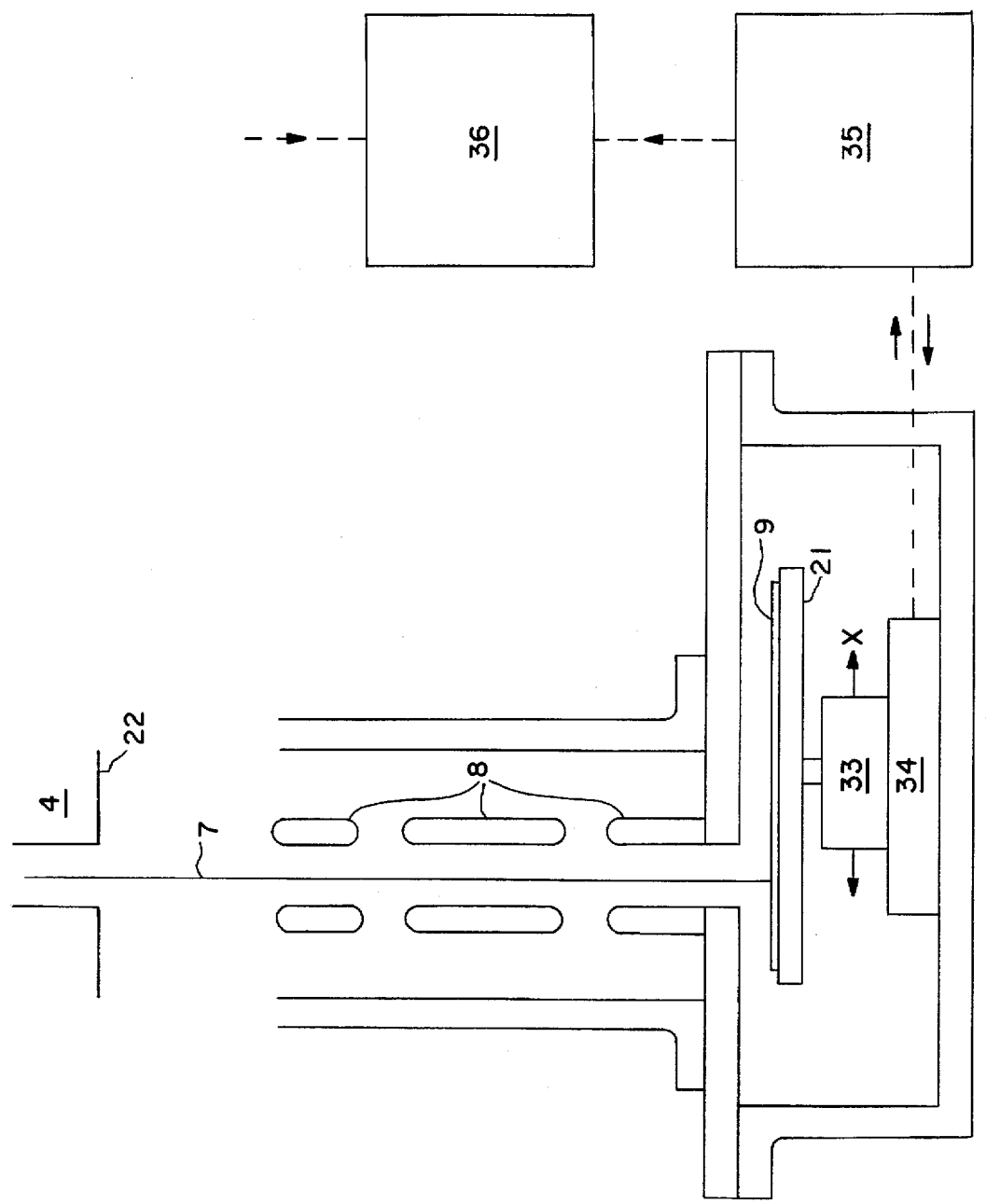

APPARATUS FOR DETECTION OF SURFACE CONTAMINATIONS ON SILICON WAFERS

1. FIELD OF THE INVENTION

The present invention relates to equipment for detection of surface contamination of silicon wafers, the principal raw material for the micro-electronic industry. There is presently nuclei with an initial energy of 100 keV after 180-degree scattering from target nuclei with mass numbers A=20, 30, 40, etc. For target nucleus $^{28}$Si (not shown) the energy is 16.0 keV and for $^{56}$Fe it is 41.9 keV. Because the silicon sample is thick, the energy spectrum of $^{12}$C scattered from the silicon substrate is continuous from 0 to 16.0 keV. This intense flux of $^{12}$C ions must be blocked from whatever detector is used to record the energy (i.e. mass) spectrum.

TABLE 1

| Kinetic energy of $^{12}$C scattered from nucleus A | | | | | | | | | | | | |
|---|---|---|---|---|---|---|---|---|---|---|---|---|
| A = | 20 | 30 | 40 | 50 | 60 | 70 | 80 | 90 | 100 | 150 | 200 | 250 |
| E = | 6.3 | 18.4 | 29.0 | 37.6 | 44.4 | 50.0 | 54.6 | 58.5 | 61.7 | 72.6 | 78.6 | 82.5 | a need for measuring surface contamination of elements heavier than silicon on the wafers with a detection sensitivity of the order of $10^{10}$ atoms per square centimeter. It is expected that in the near future this requirement will be lowered to $10^9$, possibly $10^8$, atoms per square centimeter. For comparison, the top atomic layer of silicon in a wafer contains about $10^{15}$ atoms per square centimeter.

2. DESCRIPTION OF THE RELATED ART

Surface contaminations can be studied by use of a mass-analysis technique commonly referred to as "backscattering". An ion beam of protons, $^4$He, or heavier atoms, is directed at the surface, preferably in a direction perpendicular to the surface. Incident ions that are scattered to an angle of approximately 180° to the incident direction (backscattered) are energy analyzed, for instance, by a magnetic spectrometer or by a time-of-flight method. Simple two-body kinematic analysis determines the energy of the backscattered ion: $E=[(m_1-m_2)/(m_1+m_2)]^2 E_{beam}$ where $m_1$=mass of incident ion, $m_2$=mass of target atom and $E_{beam}$=energy of incident ions. In the present case where the contamination to be measured is a very thin surface layer of atoms heavier than the silicon substrate, the energy spectrum of backscattered ions represents a true mass spectrum of the heavy surface contaminants with the "peaks" of the highest energies representing ions scattered from the heaviest masses. Because of the energy loss of ions penetrating matter, ions backscattered from the silicon substrate form a continuous, intense, lower-energy "background" spectrum extending to a maximum energy produced by ions scattered from silicon atoms at the surface.

In the energy range considered here, the scattering process is well known (Rutherford scattering) and cross section can be precisely calculated. This cross-section is proportional to $z^2Z^2$ where z is the atomic number of the incident beam particle and Z is the atomic number of the target nucleus.

In the following discussions it will be arbitrarily assumed that the primary beam particle (the scattered particle) is $^{12}$C$^+$. This ion is easy to produce in an ion source, and upon being 180-degree scattered from $^{56}$Fe, for example, its kinetic energy is not unduly small.

Rutherford scattering is, as indicated above, a simple two-body collision, where the energy of the backscattered particles can be found simply by applying conservation of energy and momentum. Table 1 shows the energies of $^{12}$C The Rutherford scattering process takes place in a cloud of atomic electrons, some of which will remain bound to the scattered particle. Hence, after scattering, an incident ion will leave the surface in a variety of charge states. The charge state distribution of heavy ions (herein defined as ions of atomic mass greater than that of alpha particles) having passed through foils of various materials have been studied extensively in connection with the design of nuclear accelerators. Several studies show that type of target material, provided it is a solid, has little effect on the charge state distribution. In the present case the primary ion, strictly speaking, has not passed through a solid, but scattered off a nucleus on the surface. For lack of better information, we assume that the charge state distributions in the two cases are similar.

Assuming $^{12}$C is the beam of choice, it is important to consider if there is a choice of kinetic energy that will optimize the yield of scattered $^{12}$C particles in a single charge state. Using data from a book by J. B. Marion and F. C. Young ("Nuclear Reaction Analysis, Graphs and Tables, North Holland publishing Company) we find that 41.9-keV carbon nuclei after having passed through a carbon foil emerge in charge state 0 with about 85 percent probability. The probabilities for charge states +1 (i.e. with 5 electrons) is about 15 percent, and for +2, less than 1 percent. By increasing the carbon beam energy to 200 keV, the yield of charge state 1 increases by a factor 2, but the Rutherford cross section decreases by a factor 4. Indeed, it appears that a 100-keV $^{12}$C beam is close to an optimum for producing a maximum yield of scattered ions in a single charge state.

It is also important to investigate if there will be an overlap of charge states in the focal plane of the magnetic spectrometer proposed here, e.g. charge state +1 and charge state +2. If the energy-sensitive detector used for backscattering analysis is a time-of-flight system or a proportional counter, charge state does not make any difference. However, if the detector is a magnetic spectrometer, the charge state needs to be considered. As it turns out, 100-keV primary carbon ions, when scattered from the heaviest nuclei, i.e. uranium, and emerging in charge state +2, have lower magnetic rigidity than carbon ions scattered from silicon and emerging in charge state +1. In other words the doubly charged spectrum does not overlap the interesting part of the singly charged spectrum.

The technique of using backscattering to measure surface contamination of silicon wafers has been employed in an instrument made at Sandia National Laboratories. It is described in a report by J. A. Knapp et al, submitted for publication in Nuclear Instruments and Methods; see also U.S. Pat. No. 5,059,785 to Doyle and Knapp. The instrument features a 150-keV $^{12}$C ion beam, and the backscattered energy spectrum is measured by a time-of flight method. Thin carbon foils in front of the detectors stop the intense flux of relatively low-energy carbon ions scattered from the silicon substrate.

3. SUMMARY OF THE INVENTION

The present invention utilizes an electrostatic barrier for stopping the ions of the beam, e.g. $^{12}$C ions, scattered from the silicon substrate from reaching the detector system. Since these ions have low energy (at 180 degree scattering, in the case of $^{12}$C, about 16 percent of the incident beam energy of typically 100 keV), they can be stopped simply by an electrostatic potential barrier. The ions scattered from the heavier atoms of the surface contamination have higher kinetic energy and will pass this barrier. Neutral $^{12}$C atoms will, of course, also pass. The barrier will have focusing properties, strong enough so that they need to be considered especially if the energy- (i.e. mass-) determining device is a magnetic or electrostatic spectrometer. The "barrier" can preferably be designed in the form of an "Einzel" lens, a term familiar to workers in the field of ion optics. It often consists of three coaxial cylindrical electrodes with the middle cylinder normally at a retarding electrostatic potential and the two outer cylinders at "ground" potential. This produces an axially symmetric lens for an ion beam. In the present case a lens equivalent to a light-optical cylinder lens, i.e. a lens focusing in one plane only, may be better suited. The lens may be made of three pairs of rectangular plates between which the beam passes. The two outer pairs of plates are normally grounded (similar to the usual arrangement of a cylinder Einzel lens.) The middle pair of plates is normally biased so as to retard the beam as it passes between the plates. This produces the desired rejection of low-energy ions while focusing the higher-energy ions that pass through in the "vertical" direction, i.e. the direction perpendicular to the plates.

4. BRIEF DESCRIPTION OF THE DRAWINGS

The invention may best be understood from the following detailed description having reference to the accompanying drawings, in which:

FIG. 1 shows a general layout of a particle accelerator with an ion source, a silicon wafer, and a magnetic spectrometer consisting of a first Einzel lens, two dipole magnets, a second Einzel lens, and a position-sensitive particle detector. The two dipole magnets may have a common set of coils and a common yoke system (similar to the Splitpole spectrometer described in U.S. Pat. No. 3,213,276.) The disclosure of said U.S. Pat. No. 3,213,276 is hereby incorporated herein by this reference thereto.

FIG. 3 is a somewhat diagrammatic and enlarged side view of the lower portion of FIG. 1.

Figure 1:
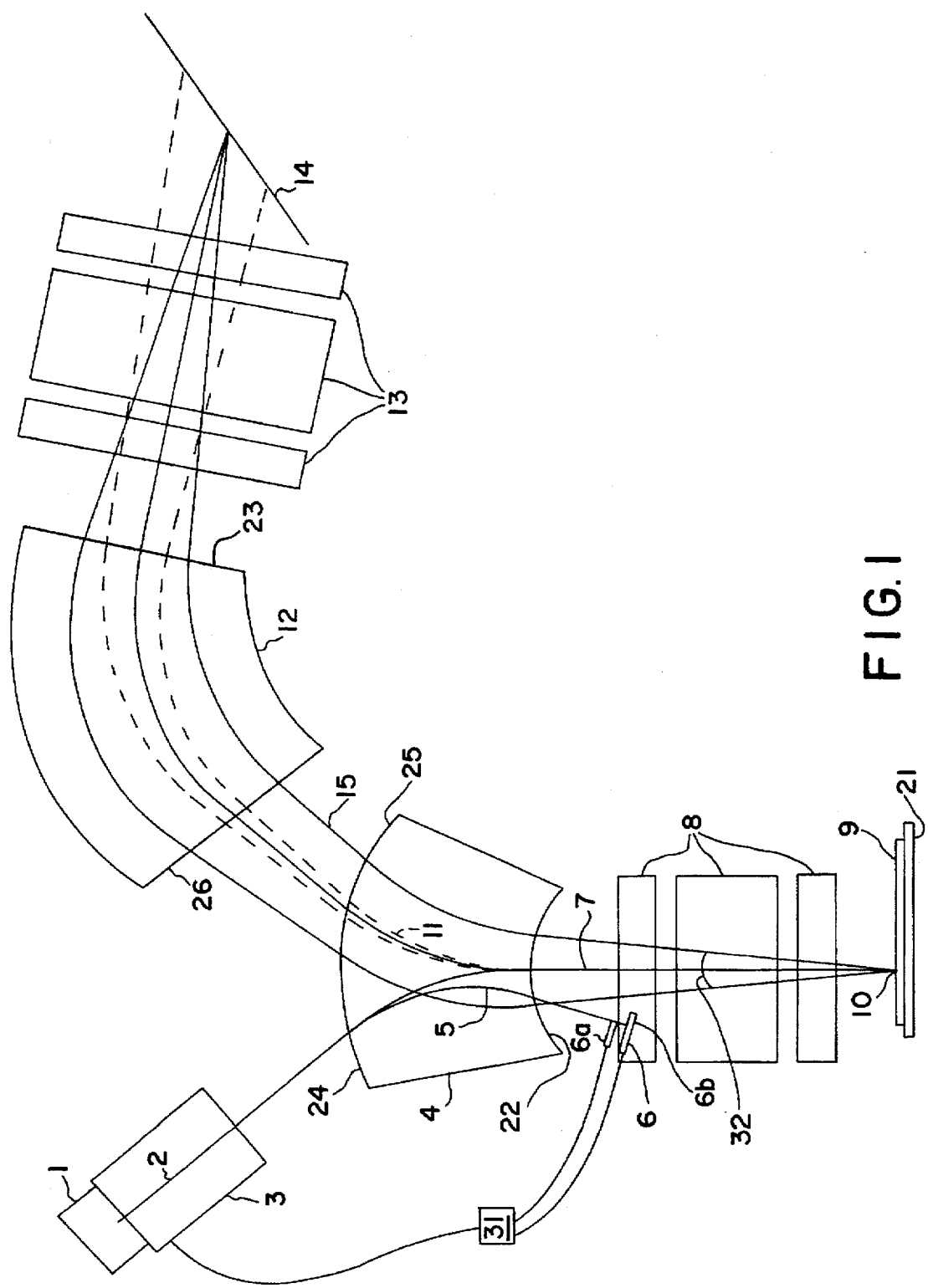

FIG. 1 indicates how particles of different p/q (momentum divided by charge) are dispersed by the spectrometer. The angular spread from the scattering point of particles with the same p/q and the refocusing of these particles to a point on the detector are shown. Also shown, with dashed lines are a low-momentum ray and a high-momentum ray.

Although not specifically shown in FIG. 1 it is clear that the ions move inside a vacuum enclosure.

5. DESCRIPTION OF THE PREFERRED EMBODIMENT

Referring to FIG. 1, the ion source 1 produces a beam 2 of charged nuclear particles, including carbon ions, mostly of charge states q=+1 and q=+2. The ions are accelerated in dc accelerator column 3 to a kinetic energy of, for instance, 100 q keV. The ions are deflected and separated according to charge state in the field of a dipole magnet of which the north pole surface 4 is shown. Trajectories produced by such a dipole magnet define a central plane. Thus, in FIG. 1 the central plane is the plane of the drawing; and in FIG. 3 the central plane coincides with the trajectory 7. The 200-keV carbon particles with charge state +2 follow path 5 to a split beam stop 6. The currents to the two parts 6a, 6b of the beam stop can be used to stabilize the energy of accelerator 3 by suitable circuitry 31. The singly charged, 100-keV particles follow path 7 through Einzel lens 8 and impinge upon silicon wafer 9, which is supported by support means 21. Focusing of the beam in the terminal of accelerator 3, at the entrance of magnet 4, and by the Einzel lens 8 produces a small beam spot 10 on wafer 9. Ions backscattered from the wafer within a solid angle of acceptance 32 with sufficient kinetic energy 11 pass again through and are focused in the transverse direction by Einzel lens 8, are dispersed and focused by the magnetic fields of dipoles 4 and 12 (extending in two separated regions of the central plane), are further focused in the transverse direction by Einzel lens 13 and produce a well-focused energy-dispersed spectrum on position-sensitive detector 14. The two sets of poles 4 and 12 form a split-pole spectrometer as described in the aforementioned U.S. Pat. No. 3,213,276, in which focusing action is produced at each boundary thereof. The boundary of dipole magnet 4 nearest the support means 21 is herein designated a first boundary 22, and the boundary of dipole magnet 12 nearest the detector 14 is herein designated a second boundary 23. The portion of the other boundary of the dipole magnet 4 through which the newly accelerated ions pass is herein designated a third boundary 24, while the remaining portion of said other boundary of the dipole magnet 4, through which the back-scattered ions pass, is herein designated a fourth boundary 25. The remaining boundary of dipole magnet 12 is herein designated a fifth boundary 26.

Said detector 14 is a focal-plane detector transverse to said central plane.

As indicated hereinabove, $^{12}$C nuclei with an initial energy of 100 keV are back-scattered from $^{56}$Fe with an energy of 41.9 keV, but are backscattered from $^{28}$Si with an energy of only 16.0 keV. Thus, the parameters of the Einzel lens 8 may readily be chosen so as to reject ions backscattered from silicon nuclei but not ions back-scattered from iron.

It will be readily understood by those skilled in this art that such focusing in the transverse direction by Einzel lens 8 increases the solid angle of acceptance of the back-scattered ions.

The separation between the region of the central plane in the magnetic field of dipole 4 and the region of the central plane in the magnetic field of dipole 12 increases progressively along the separation-gap.

As mentioned earlier, the two sets of poles of which the north pole surfaces 4 and 12 are shown can be supported by one yoke system (as shown in said U.S. Pat. No. 3,213,276) and be magnetized by the set of coils (as shown in said U.S. Pat. No. 3,213,276). In this case there will be a reduced field in the region 15 between the two set of poles, typically 15 to 20 percent of the field in the main pole gaps. Alternatively, dipole magnet 4 and dipole magnet 12 may be two completely separate magnets. In either case the four boundaries crossed by the backscattered ions can be independently shaped (as disclosed in U.S. Pat. No. 3,213,276 and elsewhere in the prior art) such as to minimize ion-optical aberrations, in other words, shaped as to sharpen the peaks in the energy spectrum of backscattered particles, which again represents a mass spectrum of the surface contamination of the wafer.

The airgap and/or the boundaries of the plates of the second Einzel lens 13 may be shaped to optimize the sharpness of the vertical focusing of the complete spectrum at the position of the detector.

Figure 2:
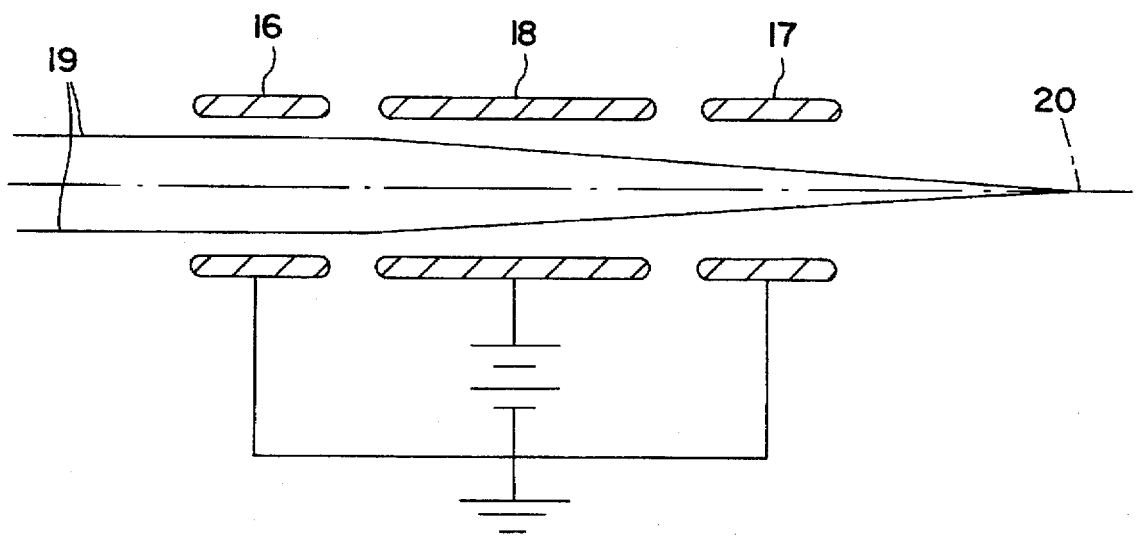
FIG. 2 shows, schematically, a side view of an "Einzel" lens consisting of three pairs of metallic plates with the middle pair biased positively, so as to retard positive ions.

Referring now to FIG. 2, the outer electrode pairs, 16 and 17, are grounded, as shown. The central pair 18 is biased positive, i.e. retarding for a positive beam. This produces vertical focusing of beam 19—to a line focus 20, as shown. Assuming that the particles in beam 19 have charge q, their paths will be reversed if their kinetic energy is less than q times the electrostatic potential they encounter in the middle of element 18.

An important feature of this proposed system is the electrostatic retarding potential embodied in the Einzel lenses, the potential of the central electrode of said lenses being chosen such that it will stop the high-intensity flux of low-energy ions, particularly beam ions scattered from silicon in the wafer. A fraction of these ions will otherwise (by charge exchange and scattering from pole pieces, for example) give false signals and form a background that may totally obscure the weak signals of ions scattered from iron or other elements, heavier than silicon.

As discussed above, another important function of the Einzel lenses is that they provide "normal-plane" focusing, i.e. focusing in the direction normal to the median plane of the magnetic dipoles. Sharp focusing in the median plane (which is provided by the combined magnet system) is important to separate the peaks in the energy spectrum (i.e. mass spectrum.) Sharp focusing in both directions are also important because it improves the signal-to-noise ratio and therefore makes it possible to detect very weak "signals".

In order to detect very small amounts of surface contaminations on a silicon wafer, either an intense beam or a relatively long exposure time is needed (or both.) Also, in order to produce a mass resolution that can separate the peaks in the spectrum that represent the heavier elements, the beam spot on the silicon wafer must be small, representing a heat problem. The wafer can be moved, e.g. spun about its axis during exposure, by means 33, and also moved in a radial direction by means 34 (as disclosed, for example, in Robertson U.S. Pat. No. 3,778,626 and Ryding U.S. Pat. No. 4,234,797). In this way the heat problem can be solved. In addition, with proper synchronized recording, a map of surface contamination can be produced, if desired. Said means for imparting two-dimensional motion to the wafer may be synchronized with said map-producing means, which may include a computer memory having three-dimensional event bins having particle energy, r and θ position on wafer. Means 35 provides power for rotational motion and two-dimensional motion of the wafer 9, records x- and θ position of the wafer at any instant, and transmits this information to the computer 36, which also receives the signals from the detector 14.

The preceding description and FIG. 1 assume that the magnetic part of the device is designed as a Split-Pole spectrometer or, alternatively, with two separate dipole magnets. It is obvious that the basic function, separation of backscattered $^{12}C$ particles according to momentum can be provided with one single dipole magnet. The advantage of the Split-Pole over this scheme is that it has four boundaries where ion-optical corrections can be made instead of two, making it simpler to produce sharp focus over a wide momentum band.

It is further obvious that one single Einzel lens, in principle, will suffice to reject the low-energy $^{12}C$ ions from reaching the detector. However, by a combination of scattering and charge exchange, some are likely to make it through to the detector, and a second potential barrier will certainly reduce this "background". Both Einzel lenses produce vertical (i.e. normal-plane focusing.) The plates of the Einzel lens at the exit can be shaped as to produce a vertical focal strength that varies with position, i.e. with momentum, thus minimizing the necessary vertical dimension of the position-sensitive focal-plane detector. This affects favorably the cost as well as the quality of the instrument.

Having thus described the principles of the invention, together with an illustrative embodiment thereof, it is to be understood that although specific terms are employed, they are used in a generic and descriptive sense, and not for purposes of limitation, the scope of the invention being set forth in the following claims:

We claim:

1. Apparatus for analyzing surface contaminations on silicon wafers in which charged particles originating from a source are deflected so as to form trajectories which define a central plane, comprising in combination:

a source of ions, means for supporting a silicon wafer transverse to said central plane, a combined beam-deflecting magnet and magnetic spectrometer system, said beam-deflecting magnet directing ions from said source having a single charge state and the same energy to said silicon wafer, said magnetic spectrometer system momentum-analyzing and focusing those of said ions which are back-scattered from said silicon wafer, said system including means for producing a substantially homogeneous and uniform magnetic field perpendicularly across at least one region of said central plane, said silicon wafer being outside said magnetic field near a first boundary thereof, a focal-plane detector transverse to said central plane outside said magnetic field near a second boundary thereof, means for accelerating said ions from said source to an energy of the order of $10^5$ eV and for delivering said ions as a beam into said magnetic field along said central plane at a third boundary thereof, whereby said beam is deflected by said magnetic field and emerges from said magnetic field through said first boundary thereof and strikes said wafer substantially perpendicular thereto and is scattered back by Rutherford scattering caused by atoms in said wafer and on a surface of said wafer, whereby said ions which strike said wafer have the same charge state and energy, said system being so positioned and said boundaries being so shaped that said back-scattered ions re-enter said magnetic field at said first boundary thereof, are momentum-analyzed and focused thereby, and emerge therefrom through said second boundary so as to be directed to said detector, and a first electrostatic Einzel lens between said first boundary and said wafer which provides a retarding electrostatic field strong enough to reject lower energy ions back-scattered from light nuclei such as silicon nuclei in the wafer, but not the ions back-scattered from heavier nuclei on the surface of the wafer, wherein said first Einzel lens providing a focusing of the back-scattered ions transverse to said central plane so as to increase a solid angle of acceptance of said back-scattered ions.

2. Apparatus in accordance with claim 1, further including a second electrostatic Einzel lens between said second boundary and said detector which lens provides a retarding electrostatic field strong enough to reject low energy ions which are caused by scattering from pole surfaces and charge exchange may move in a direction towards the detector, and said second Einzel lens providing focusing transverse to said central plane of the ions back-scattered from said surface contamination on the wafer so as to minimize a vertical area covered by said back-scattered ions striking the focal-plane detector.

3. Apparatus in accordance with claim 1, wherein said means for producing a substantially homogeneous and uniform magnetic field produces a substantially homogeneous and uniform magnetic field perpendicularly across two separated regions of said central plane, a separation between the two regions increasing progressively along a separation-gap, said back-scattered ions emerging from a first of said regions to be traversed thereby through a fourth boundary, crossing the separation-gap, and entering a second of said regions to be traversed thereby through a fifth boundary.

4. Apparatus in accordance with claim 1, wherein said ions are $^{12}C^+$.

5. Apparatus in accordance with claim 1, wherein said boundaries are shaped to optimize the sharpness of focus of said ions.

6. Apparatus in accordance with claim 1, wherein said magnetic field is produced by a single magnet with one pair of coils.

7. Apparatus in accordance with claim 1, further including means for rotating said wafer to distribute heat produced by said ion beam.

8. Apparatus in accordance with claim 7, further including means for imparting two-dimensional motion to said wafer and means for producing a map of contaminants on the wafer, said map-producing means including a computer memory having three-dimensional event bins having energy, r and θ position on said wafer and means for synchronizing said two-dimensional motion of said wafer with said bins.

9. Apparatus in accordance with claim 1, further including a split beam stop having two parts and being positioned to receive said ions in said beam which have a charge state other than said single charge state, and means for causing currents of said ions to the two parts of said beam stop to stabilize said means for accelerating said ions.

10. A method of analyzing surface contaminations on silicon wafers, which method comprises the following steps: (a) producing a beam of heavy ions, (b) directing a portion of said beam of said heavy ions having a single charge and the same energy, to the silicon wafer, (c) momentum-analyzing and focusing a beam of ions that is back-scattered from the silicon wafer, (d) providing a retarding electrostatic field strong enough to reject lower energy ions back-scattered from light nuclei such as silicon nuclei in the wafer, but not from heavier nuclei on a surface of the wafer, (e) providing vertically transverse a focusing of the back-scattered ions, and (f) detecting a distribution of said back-scattered ions which arrive at a focal plane, said tranverse focusing serving to reduce a vertical area covered by said back-scattered ions arriving at the focal-plane.

* * * * *